United States Patent
Mishra et al.

(10) Patent No.: US 7,935,985 B2
(45) Date of Patent: May 3, 2011

(54) N-FACE HIGH ELECTRON MOBILITY TRANSISTORS WITH LOW BUFFER LEAKAGE AND LOW PARASITIC RESISTANCE

(75) Inventors: Umesh K. Mishra, Montecito, CA (US); Yi Pei, Goleta, CA (US); Siddharth Rajan, Goleta, CA (US); Man Hoi Wong, Goleta, CA (US)

(73) Assignee: The Regents of the University of Califonia, Oakland, CA (US)

( * ) Notice: Subject to any disclaimer, the term of this patent is extended or adjusted under 35 U.S.C. 154(b) by 490 days.

(21) Appl. No.: 12/059,902

(22) Filed: Mar. 31, 2008

(65) Prior Publication Data

US 2008/0237640 A1   Oct. 2, 2008

Related U.S. Application Data

(60) Provisional application No. 60/908,914, filed on Mar. 29, 2007.

(51) Int. Cl.
    *H01L 29/66* (2006.01)
(52) U.S. Cl. . 257/194; 257/183; 257/201; 257/E21.403; 257/E21.112; 257/E29.081; 438/285; 438/478
(58) Field of Classification Search .......... None
    See application file for complete search history.

(56) References Cited

U.S. PATENT DOCUMENTS

| | | |
|---|---|---|
| 6,849,882 B2 | 2/2005 | Chavarkar et al. |
| 6,878,593 B2 | 4/2005 | Khan et al. |
| 2001/0023964 A1 * | 9/2001 | Wu et al. .............. 257/368 |
| 2006/0006414 A1 | 1/2006 | Germain et al. |
| 2006/0255364 A1 | 11/2006 | Saxler et al. |
| 2007/0235775 A1 * | 10/2007 | Wu et al. .............. 257/288 |

OTHER PUBLICATIONS

International Search Report, International application No. PCT/US08/58938, International filing date Mar. 31, 2008.
Fehlberg et al., International Workshop on Nitride Semiconductors 2006, Phys. Stat. Sol (c) 4, No. 7, 2423-2427 (2007).
Heikman et al., Appl. Phys. Lett. 81(3) 439-441 (2002).
Poblenz et al., J. Vac. Sci. Technol. B 22(3), 1145-1149 (2004).
Poblenz et al., J. Vac. Sci. Technol. B 23(4), 1562-1567 (2005).

\* cited by examiner

*Primary Examiner* — Charles D Garber
*Assistant Examiner* — Yasser A Abdelaziez
(74) *Attorney, Agent, or Firm* — Gates & Cooper LLP

(57) ABSTRACT

A method for fabricating nitrogen-face (N-face) nitride-based electronic devices with low buffer leakage, comprising isolating a buffer from a substrate with an AlGaInN nucleation layer to suppress impurity incorporation from the substrate into the buffer. A method for fabricating N-face nitride-based electronic devices with low parasitic resistance and high breakdown, comprising capping a device structure with a conductive layer to provide extremely low access and/or contact resistances, is also disclosed.

18 Claims, 5 Drawing Sheets

N-FACE HIGH ELECTRON MOBILITY TRANSISTORS WITH LOW BUFFER LEAKAGE AND LOW PARASITIC RESISTANCE

CROSS-REFERENCE TO RELATED APPLICATIONS

This application claims the benefit under 35 U.S.C. Section 119(e) of the following co-pending and commonly-assigned U.S. patent application:

U.S. Provisional Patent Application Ser. No. 60/908,914, filed on Mar. 29, 2007, by Umesh K. Mishra, Yi Pei, Siddharth Rajan, and Man Hoi Wong, entitled "N-FACE HIGH ELECTRON MOBILITY TRANSISTORS WITH LOW BUFFER LEAKAGE AND LOW PARASITIC RESISTANCE,";

which application is incorporated by reference herein.

This application is related to the following co-pending and commonly assigned application:

U.S. Utility patent application Ser. No. 12/059,907, filed on Mar. 31, 2008, by Umesh K. Mishra, Lee S. McCarthy, Chang Soo Suh and Siddharth Rajan, entitled "METHOD TO FABRICATE III-N SEMICONDUCTOR DEVICES ON THE N-FACE OF LAYERS WHICH ARE GROWN IN THE III-FACE DIRECTION USING WAFER BONDING AND SUBSTRATE REMOVAL", which application claims priority under Section 119(e) of U.S. Provisional Patent Application Ser. No. 60/908,917, filed on Mar. 29, 2007, by Umesh K. Mishra, Lee S. McCarthy, Chang Soo Suh and Siddharth Rajan, entitled "METHOD TO FABRICATE III-N SEMICONDUCTOR DEVICES ON THE N-FACE OF LAYERS WHICH ARE GROWN IN THE III-FACE DIRECTION USING WAFER BONDING AND SUBSTRATE REMOVAL,";

which application is incorporated by reference herein.

STATEMENT REGARDING FEDERALLY SPONSORED RESEARCH AND DEVELOPMENT

This invention was made with Government support under Grant Nos. N00014-05-1-0419 (ONR MINE), H94003-06-2-0606 (DARPA CNID), and F49620-03-1-0235 (AFOSR). The Government has certain rights in this invention.

BACKGROUND OF THE INVENTION

1. Field of the Invention

The present invention is related to the development of Nitrogen face (N-face) nitride based millimeter (mm) wave transistors with high power and high efficiency, through achieving low parasitic resistances and orders of magnitude reduction in leakage.

2. Description of the Related Art (Note: This application references a number of different publications as indicated throughout the specification by one or more reference numbers within brackets, e.g., [Ref. x]. A list of these different publications ordered according to these reference numbers can be found below in the section entitled "References." Each of these publications is incorporated by reference herein.)

Gallium nitride (GaN) devices have been shown to be promising for high voltage high frequency applications, due to the high breakdown field and high electron velocity in GaN, as well as high charge density in the channel. Growth of a high quality and reliable semi-insulating buffer is essential for low DC dissipation and sharp pinch-off of high electron mobility transistors (HEMTs).

Unintentionally-doped (UID) gallium face (Ga-face) GaN, grown directly on silicon face (Si-face) silicon carbide (SiC), exhibits varied degrees of n-type conductivity. Silicon (Si) incorporated into the UID GaN from the SiC substrate, which becomes a shallow donor, is a major source of free carriers based on secondary ion mass spectroscopy (SIMS) measurements. A successful approach to suppress buffer leakage was the growth of a large bandgap aluminum nitride (AlN) nucleation layer prior to growing the buffer [Ref. 1]. The AlN isolates the GaN from the SiC substrate and prevents Si incorporation into the buffer. Acceptor doping by iron [Ref 2] or carbon [Ref 3] have also been employed to compensate unintentional shallow donors (such as oxygen) in GaN.

The performance of highly-scaled nitride-based HEMTs is limited by parasitic resistances at the ohmic contacts. In devices grown on the Ga-polar or (0001) orientation, multiple technologies such as $n^+$ cap layers, ion implantation, multi-channels and regrown ohmic regions have been used to obtain lower ohmic contact resistance. In Ga-face HEMTs, however, the presence of a large bandgap barrier cap, as well as a conduction band discontinuity between the two-dimensional electron gas (2DEG) and the ohmic metal, introduce inevitable challenges for further reduction of the contact resistance.

SUMMARY OF THE INVENTION

The present invention discloses a method for fabricating N-face nitride-based electronic devices with low buffer leakage, comprising isolating a buffer from a substrate with an N-face or (000-1) oriented AlGaInN nucleation layer to suppress impurity incorporation from the substrate into the buffer, and depositing N-face device layers on the buffer. The substrate may be carbon-Face (C-Face) SiC.

The present invention also discloses a method for fabricating N-face nitride-based electronic devices with low parasitic resistance, comprising capping an N-face semiconductor device structure with an N-face conductive $Al_xGa_yIn_{1-x-y}N$ layer, where x and y are between 0 and 1 inclusively, to provide access or contact resistances, or access and contact resistances, which are lower than those obtained in a structure which is without the N-face conductive layer but with the same ohmic metallization scheme. The device structure may comprise a 2DEG, and the N-face conductive $Al_xGa_yIn_{1-x-y}N$ layer may be doped to achieve a smaller tunneling barrier for electrons between the N-face semiconductor device structure and an ohmic metal on the device structure's surface, and to achieve a Fermi level for the device closer to or above the device structure's conduction band edge between the 2DEG and the surface.

The doping may be achieved by introducing dopants during growth, by ion implantation, or by grading the N-face conductive $Al_xGa_yIn_{1-x-y}N$ layer. The method may further comprise finishing the N-face conductive $Al_xGa_yIn_{1-x-y}N$ layer with a higher indium content N-face layer, as compared to underlying $Al_xGa_yIn_{1-x-y}N$ layers, so as to utilize a higher density of intrinsic bulk and surface charges present in indium nitride to reduce a tunneling barrier for electrons between the semiconductor device structure and the ohmic metal, wherein the higher indium content N-face layer can be doped, graded, grown digitally, or grown digitally and graded.

The $Al_xGa_yIn_{1-x-y}N$ layer may be removed in a gate region of the semiconductor device structure so that the gate can capacitively modulate a channel of the 2DEG. The method may further comprise positioning an insulator under the gate.

A transistor may be fabricated using the above methods.

The present invention further discloses an N-face heterostructure, comprising an N-face nucleation layer made of (Al,Ga,In)N for substrate isolation and deposited on a substrate, a buffer layer made of (Al,Ga,In)N and comprised of one or more sublayers on top of the N-face nucleation layer, and one or more N-face device layers on the buffer.

The one or more N-face device layers may comprise one or more N-face first layers of (Al,Ga,In)N on the buffer layer to induce a 2DEG on top of the N-face first layers of (Al,Ga,In)N, to provide back barrier confinement for the electrons, to enhance 2DEG mobility, to increase electron velocity, and/or to provide higher breakdown voltage, and one or more N-face conductive second layers of (Al,Ga,In)N grown above the 2DEG providing lower contact or access resistances, or lower contact and access resistances than a heterostructure without the second layers.

The one or more N-face conductive second layers of (Al,Ga,In)N may be capped with a higher indium content N-face nitride layer so as to utilize a high density of intrinsic bulk and surface charges present in InN to reduce the tunneling barrier for electrons between the semiconductor device structure and the ohmic metal, wherein the higher indium content N-face nitride layer can be doped, graded, grown digitally, or grown digitally and graded.

The present invention further discloses a nitrogen face (N-face) nitride-based electronic device capped with an (000-1) oriented conductive $Al_xGa_yIn_{1-x-y}N$ layer, where x and y are between 0 and 1 inclusively, and having access or contact resistances, or access and contact resistances, which are lower than those obtained in a device which is without the (000-1) oriented conductive $Al_xGa_yIn_{1-x-y}N$ layer, but with the same ohmic metallization scheme.

BRIEF DESCRIPTION OF THE DRAWINGS

Referring now to the drawings in which like reference numbers represent corresponding parts throughout.

DETAILED DESCRIPTION OF THE INVENTION

In the following description of the preferred embodiment, reference is made to the accompanying drawings that form a part hereof, and in which is shown by way of illustration a specific embodiment in which the invention may be practiced. It is to be understood that other embodiments may be utilized and structural changes may be made without departing from the scope of the present invention.

Overview

The present invention discloses new methods to fabricate N-face nitride-based electronic devices with low buffer leakage, low parasitic resistance and high breakdown. The methods comprise isolating the buffer from the substrate with an aluminum gallium indium nitride (AlGaInN) nucleation layer to suppress impurity incorporation from the substrate into the buffer, and capping the structure with a highly conductive layer to provide extremely low access and contact resistances. These new techniques offer improvements that are critical for developing mm-wave transistors with high power and high efficiency.

N-Face Transistors on Carbon Face (C-face) SiC with $Al_xGa_yIn_{1-x-y}N$ Nucleation for Buffer Insulation Recently, our group has exploited the use of N-face nitride semiconductors to develop new electronic devices with improved performance. Some examples include depletion mode HEMTs with lower gate current, HEMTs with improved back-barrier confinement and enhancement-mode operation. SIMS measurements on UID N-face GaN buffers grown directly on C-face SiC (GaN/SiC curve in FIGS. 1 and 2) reveal a high degree of Si (FIG. 1) and C (FIG. 2) incorporation from the SiC into the GaN buffer, resulting in uncontrollable and varying degrees of n-type parallel conduction through the buffer in N-face HEMTs, depending on the relative amount of incorporation of these donor and acceptor species. The level of incorporation might also be affected by growth conditions such as growth temperature. In this disclosure, the present invention proposes the use of an N-face nucleation layer to suppress impurity incorporation in N-face HEMTs.

Figure 3:
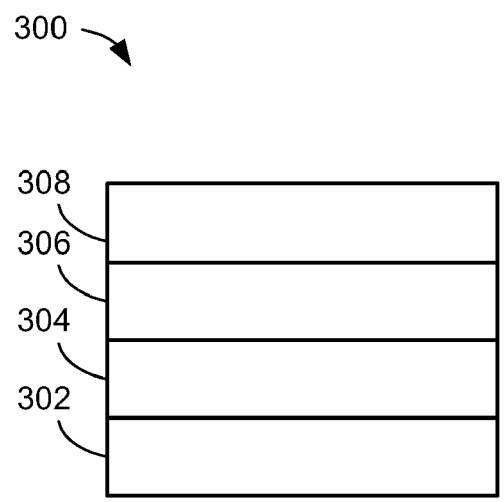
FIG. 3 is a schematic illustrating the general structure of an N-face HEMT structure with $Al_xGa_yIn_{1-x-y}N$ nucleation layer, according to the present invention.

The most general description of the structure 300 covered in this disclosure is comprised of the following layers, shown schematically in FIG. 3 (from bottom to top):

C-face SiC 302

An $Al_xGa_yIn_{1-x-y}N$ (where x and y are between 0 and 1 inclusively) nucleation layer 304, which could be doped for higher resistivity.

A buffer layer 306 made of (Al,Ga,In)N and comprised of one or more sublayers in order to reduce threading dislocation density and/or provide good morphology for the layers 308 on top of it. The buffer 306 might be doped for higher resistivity.

(Al,Ga,In)N layers 308 above the buffer layer 306 designed to achieve the desired functionality of the transistor. These layers might be grown digitally, and might be doped and/or graded if necessary.

SIMS measurements (the GaN/AlN/SiC curve in FIGS. 1 and 2) show that the N-face $Al_xGa_yIn_{1-x-y}N$ nucleation layer, where x=1 and y=0 for these samples, effectively suppresses Si and C incorporation and long tailing from SiC into the UID GaN.

Figure 4:
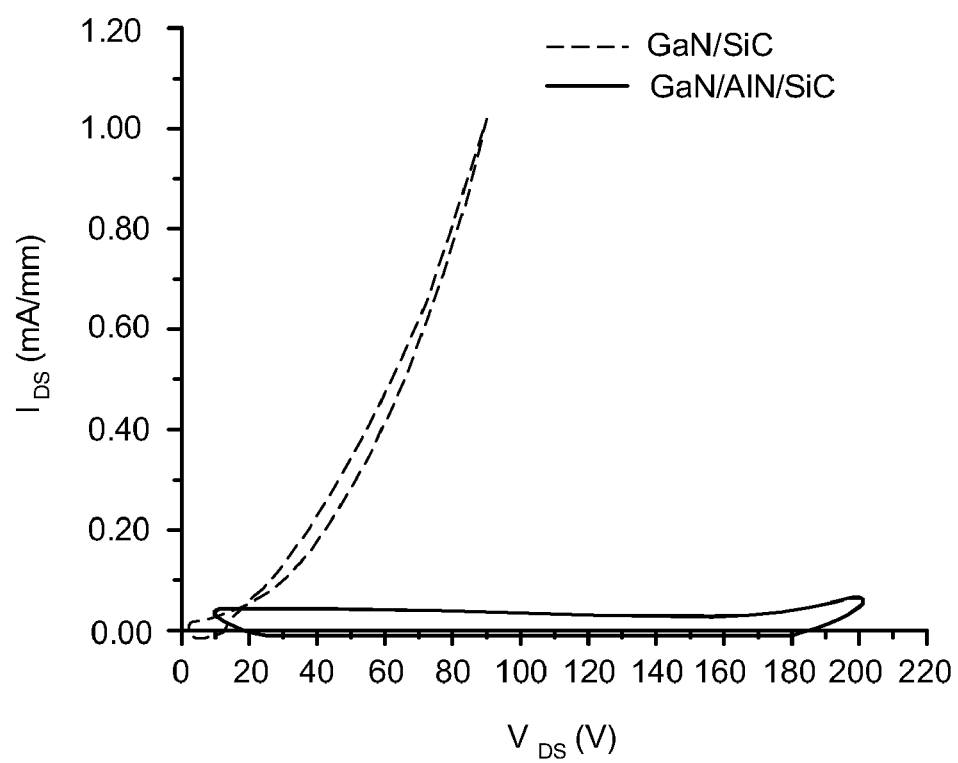
FIG. 4 is a graph of buffer leakage measurement of GaN/SiC and GaN/AlN/SiC buffer structures (GaN buffer and AlN nucleation layer), wherein the nitride films are of N-polarity grown on C-face SiC, and plotting drain source current ($I_{ds}$) as a function of drain-source voltage ($V_{ds}$).

FIG. 4 is a graph of buffer leakage measurement of GaN/SiC and GaN/AlN/SiC buffer structures, wherein the nitride films are of N-polarity grown on C-face SiC. FIG. 4, shows that buffer leakage at 1 mA per mm of gate width is uniform and consistent at drain source voltage ($V_{DS}$)>200 V for devices with the AlN nucleation layer (the GaN/AlN/SiC curve), in contrast to uncontrolled and potentially high buffer conduction for GaN directly nucleated on SiC (the GaN/SiC curve).

Controlled doping of the buffer by acceptors such as iron or carbon can be used in conjunction with the $Al_xGa_yIn_{1-x-y}N$ nucleation layer to achieve a high quality semi-insulating buffer layer.

Low Contact Resistance N-face HEMTs Utilizing a Highly Conductive Cap Layer

In this disclosure, the present invention proposes the use of N-face or (000-1) orientation materials for devices with lower contact resistances than their Ga-face counterparts. Due to the reversed direction of polarization in N-face materials, the 2DEG in N-face heterostructures is induced with the barrier layer below and the channel layer above the 2DEG. Therefore, an ohmic contact can be made to the 2DEG without having to go through a barrier layer or a conduction band discontinuity. This is a unique advantage in N-face heterostructures for obtaining low contact and access resistances.

Figure 5:
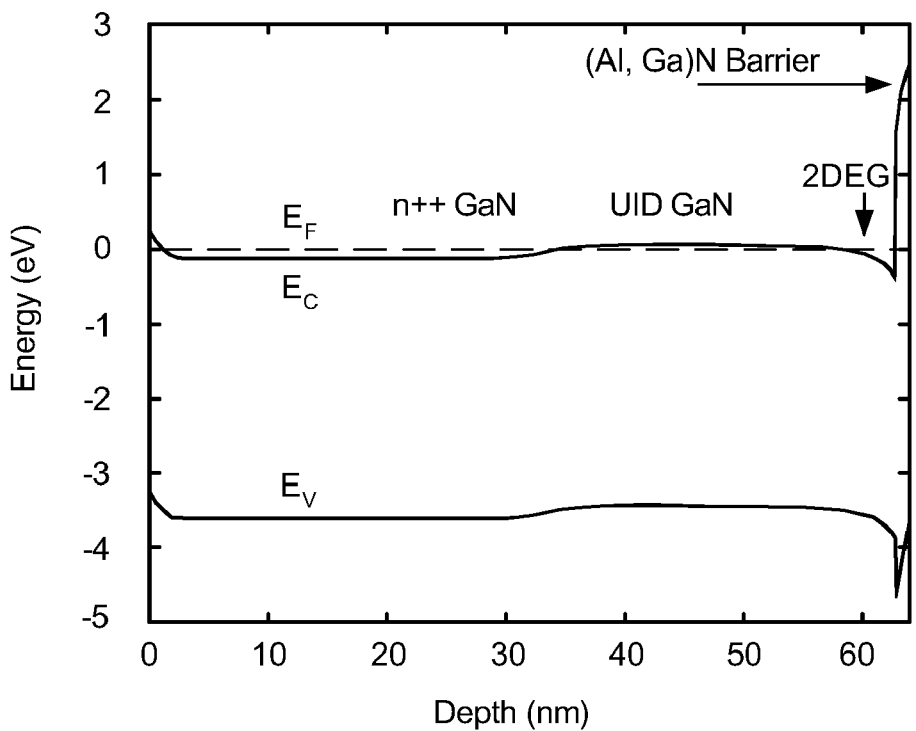
FIG. 5 is an implementation of a highly conductive cap layer in the ohmic and access regions of an N-face heterostructure, showing the narrow surface barrier and low resistivity pathway between the 2DEG and the surface.

This disclosure focuses on the layer design above the 2DEG channel. This layer is made of $Al_xGa_yIn_{1-x-y}N$ with an appropriate composition such that its bandgap and polarization coefficients are smaller than those of the layer immediately underneath in order to induce and confine the 2DEG. The top portion or the whole of the $Al_xGa_yIn_{1-x-y}N$ in the ohmic and/or access regions is intentionally doped n-type beyond the background level in order to obtain contact resistance, access resistance, tunneling barrier and/or resistivity lower than those obtained in a structure which is without the intentional n-doped layer but with the same ohmic metallization scheme. This is illustrated in FIG. 5, which is the band diagram for an N-face heterostructure comprising a highly conductive n++ GaN cap layer in the ohmic and access regions of an N-face heterostructure, UID GaN, a 2DEG, and an (Al,Ga)N barrier. FIG. 5 illustrates:

Narrow depletion region and hence small tunneling barrier for electrons between the semiconductor and the ohmic metal;

Fermi level ($E_F$) being close to or above the conduction band edge ($E_C$) from the 2DEG to the surface, which offers low resistivity electrostatic connection between the 2DEG and the metal. FIG. 5 also shows the valence band ($E_V$).

Figure 6:
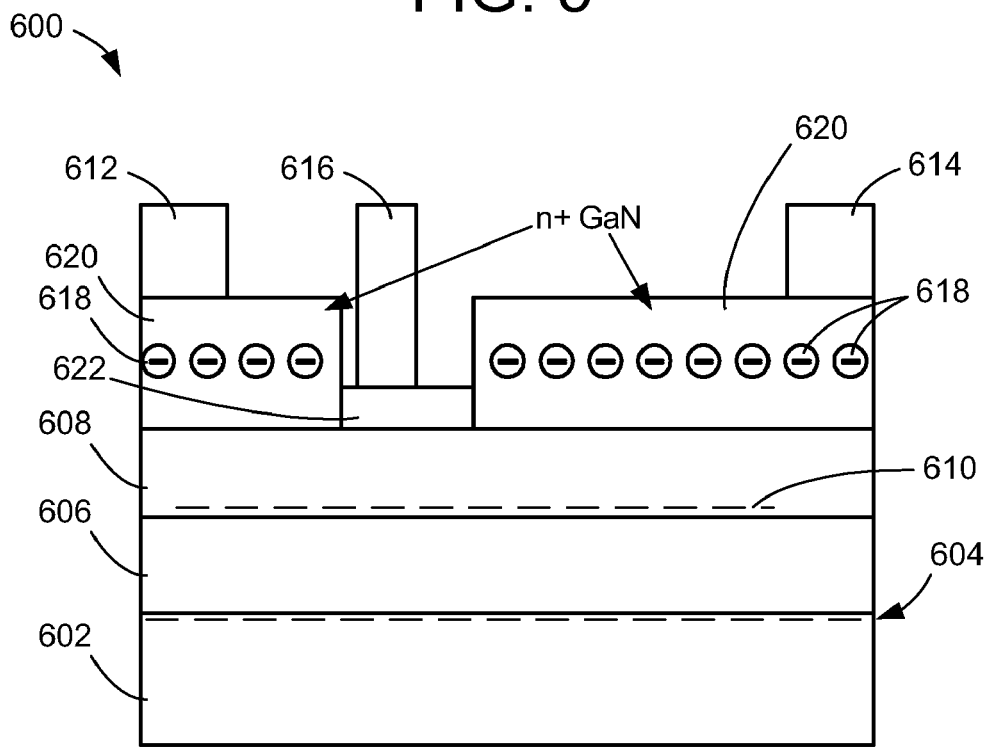
FIG. 6 is a schematic of a representative N-face HEMT with an in-situ heavily n-doped GaN cap layer.
Figure 7:
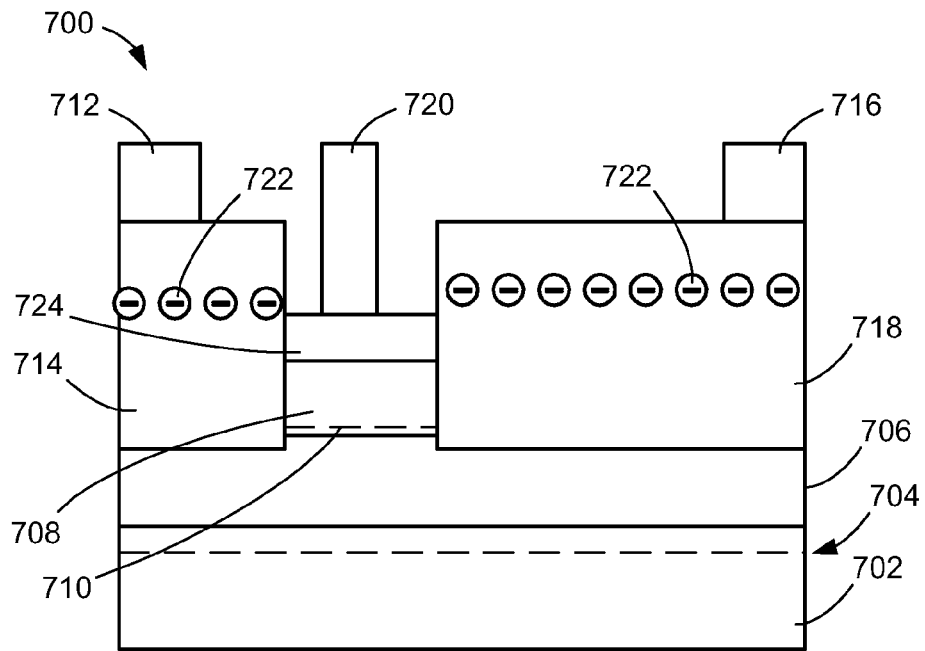
FIG. 7 is a schematic of a representative N-face HEMT with an implanted cap layer.
Figure 8:
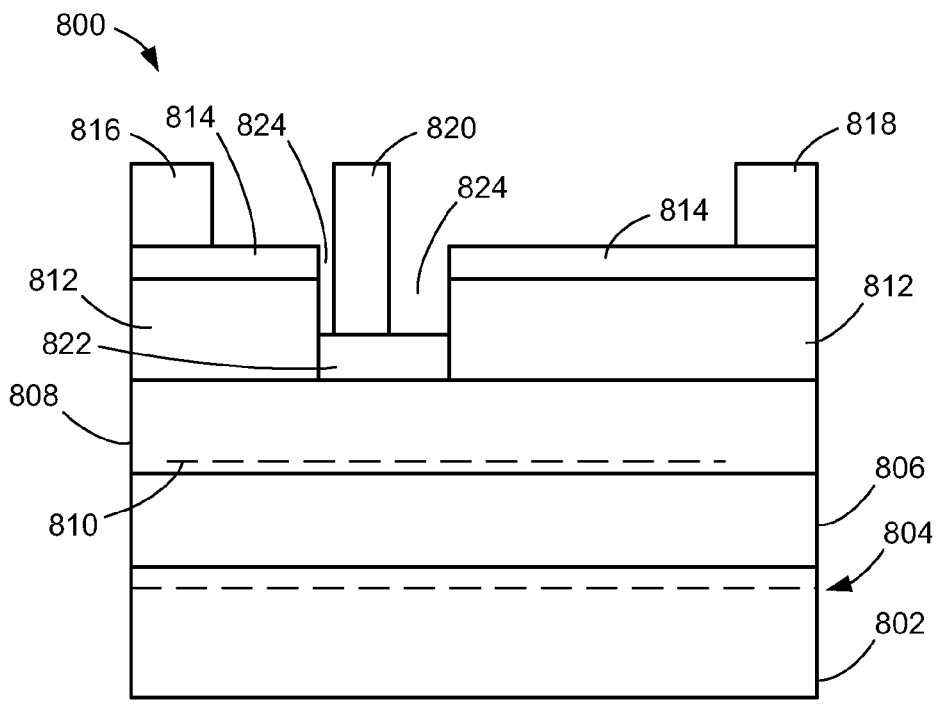
FIG. 8 is a schematic of a representative N-face HEMT with a graded InGaN layer topped by a high In-content layer (100% indium in this illustration).

FIGS. 6-8 are schematics of N-face HEMTS 600, 700, 800.

In FIG. 6 the HEMT device 600 comprises of a GaN layer 602 with Si doping 604, an AlGaN barrier layer 606 on the GaN layer 602, a channel GaN layer 608 on the AlGaN barrier layer 606, a 2DEG 610 confined in the channel GaN layer 608, a source 612 and a drain 614 contact, and a gate 616 in between the source 612 and the drain 614.

FIG. 7 illustrates a HEMT device 700 comprising a GaN layer 702 with Si doping 704, an AlGaN barrier layer 706 on the GaN layer 702, a channel GaN layer 708 on the AlGaN barrier layer 706, a 2DEG 710 confined in the channel GaN layer 708, a source 712 contact to the ohmic region 714, a drain contact 716 to the access region 718, and a gate 720 in between the source 712 and the drain 716.

In FIG. 8, the HEMT device 800 comprises of a GaN layer 802 with Si doping 804, an AlGaN barrier layer 806 on the GaN layer 802, a channel GaN layer 808 on the AlGaN barrier layer 806, a 2DEG 810 confined in the channel GaN layer 808, a graded InGaN layer 812 on the channel GaN layer 808, an InN layer 814 on the graded layer 812, and source 816 and drain 818 contacts made to the InN layer 814. A gate 820 is in between the source 816 and the drain 818.

Doping can be done by one or more of, but not limited to, the following methods:

Introducing dopants 618 during growth, which could be performed digitally for strain relief and better surface morphology, to form an n+ GaN layer 620 on top of the GaN channel layer 608, to which the source 612 and drain 614 are contacted (FIG. 6);

Ion implantation 722 in the ohmic 714 and/or access regions 718 (FIG. 7);

Grading the $Al_xGa_yIn_{1-x-y}N$ (where x and y are between 0 and 1 inclusively) from a large bandgap to a smaller bandgap. In the N-face polarity, such grading scheme induces a fixed positive space charge which is capable of attracting a high concentration of electrons to render the graded region highly conductive (modulation doping). The grading could be done digitally or in steps, and intermediate layers of arbitrary composition/thickness might be inserted within the graded layer to engineer the strain of the graded layer. A typical example of a graded layer implementation is shown in FIG. 8, where the undoped GaN channel 808 is graded to InGaN 812.

Finishing the structure with a layer 814 containing higher indium-content than the doped $Al_xGa_yIn_{1-x-y}N$ layer, so as to utilize the high density of intrinsic bulk and surface charges present in Indium Nitride (InN) [Ref. 4] to reduce the tunneling barrier for electrons between the semiconductor and the ohmic metal (FIG. 8). This high indium-content layer 814 can be doped, graded, and/or grown digitally.

Figure 9:
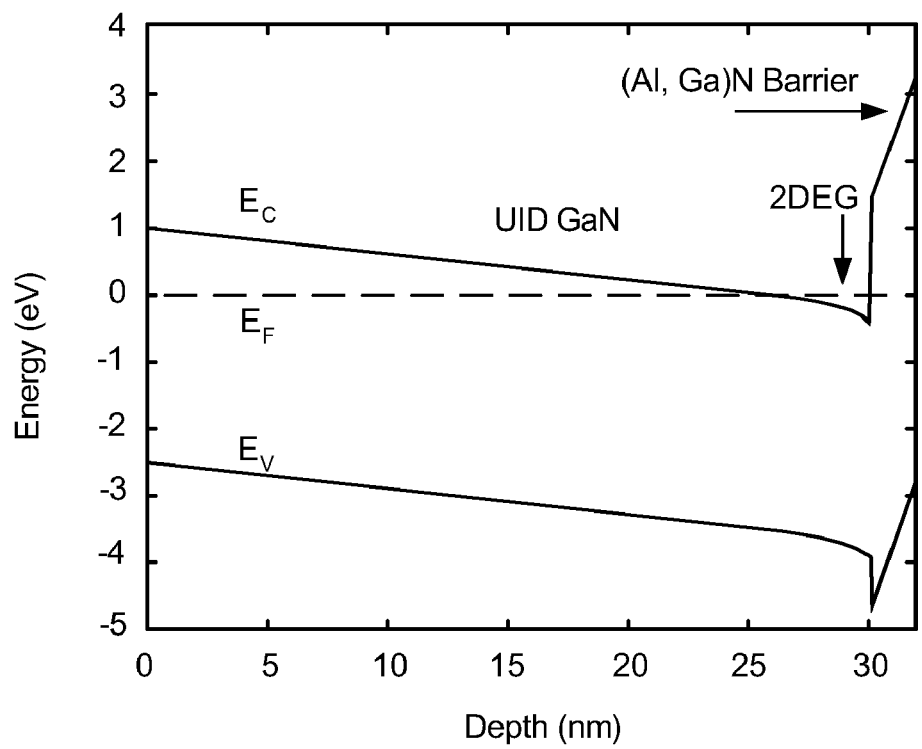
FIG. 9 is a band diagram under the gate region of the HEMT structure shown in FIG. 6.
Figure 10:
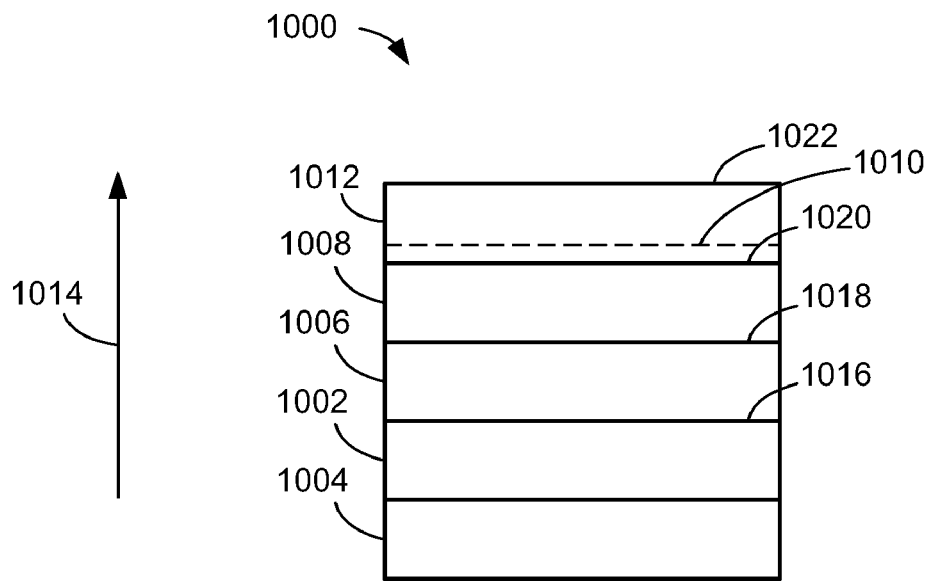
FIG. 10 is a schematic cross section of the N-face heterostructures covered in this disclosure.

The doped region under the gate 616, 720, 820 is removed so that the gate 616, 720, 820 can capacitively modulate the 2DEG channel 610, 710, 810. Insulators 622, 724, 822, including but not limited to silicon nitrides and oxides, may be deposited under the gate metal 616, 720, 820 to reduce gate leakage. A representative band diagram under the gate region is shown in FIG. 9, showing $E_F$, $E_V$ and $E_C$ through the UID GaN layer, the 2DEG and the (Al,Ga)N layer of FIG. 6.

The material immediately surrounding the gate 820 may also be removed to isolate the gate, as shown by 824 in FIG. 8, for example.

Both annealed and non-alloyed ohmics can be used for the above designs.

A general description of the N-face heterostructures 300, 600, 700, 800, and 1000 covered in this disclosure is composed of the following layers (from bottom to top), as illustrated in FIG. 3, FIGS. 6-8, and FIG. 10:

A nucleation layer 304, 1002 made of (Al,Ga,In)N, for substrate 1004 isolation, which could be doped for higher resistivity, and deposited on a substrate 1004.

A buffer layer 306, 1006 made of (Al,Ga,In)N and comprised of one or more sublayers in order to reduce threading dislocation density and/or provide good morphology for the layers on top of it. The buffer might be doped for higher resistivity.

One or more layers of (Al,Ga,In)N 606, 706, 806, 1008 which can be graded, doped and/or grown digitally, to induce a 2DEG 610, 710, 810, 1010 on the top, provide back barrier confinement for the electrons, enhance 2DEG mobility, increase electron velocity, and/or provide higher breakdown voltage.

One or more layers of (Al,Ga,In)N 620, 714, 718, 812, 814, 1012 grown above the 2DEG 610, 710, 810, 1010 for low contact and/or access resistances as described in previous paragraphs of this disclosure.

Examples of devices which can be fabricated using the present invention comprise high performance mm-wave transistors for telecommunications.

Typical Embodiments of the Present Invention

FIG. 3 illustrates a method for fabricating N-face nitride-based electronic devices with low buffer leakage, comprising isolating a buffer 306 from a substrate 302 with an AlGaInN nucleation layer 304 to suppress impurity incorporation from the substrate 302 into the buffer 306. For example, the AlGaInN nucleation layer may be grown in the N-face direction <000-1> direction on a C-face SiC, such that the last grown surface of the nucleation layer has an N-face, and depositing N-face or (000-1) orientated device layers 308 on the buffer 306.

Figure 1:
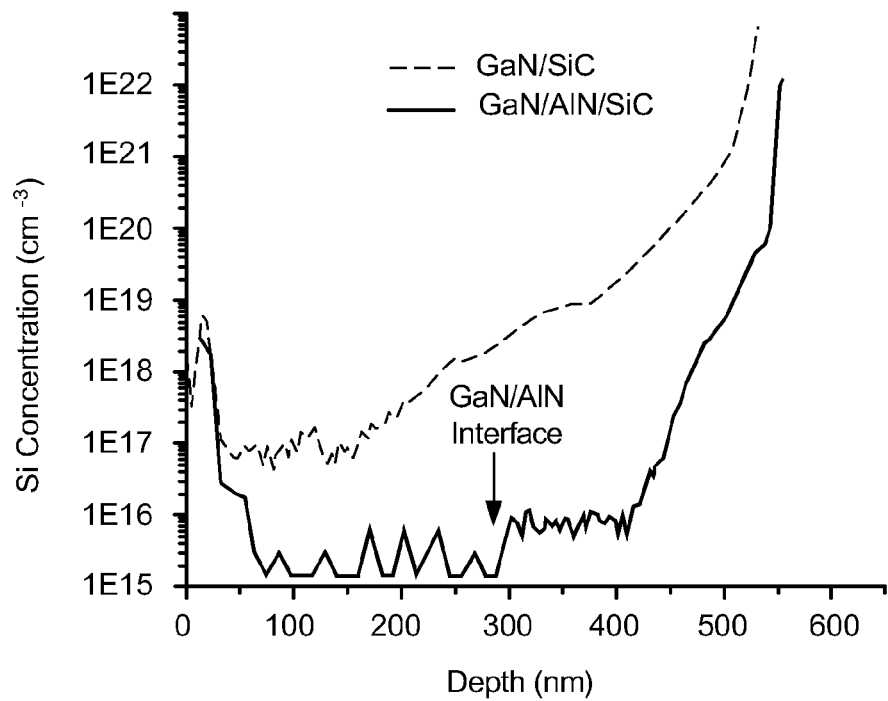
FIG. 1 is a graph showing SIMS measurements of Si incorporation in GaN/SiC and GaN/AlN/SiC buffer structures (GaN buffer and AlN nucleation layer), wherein the nitride films are of nitrogen polarity (N-polarity) grown on carbon face (C-face) SiC.
Figure 2:
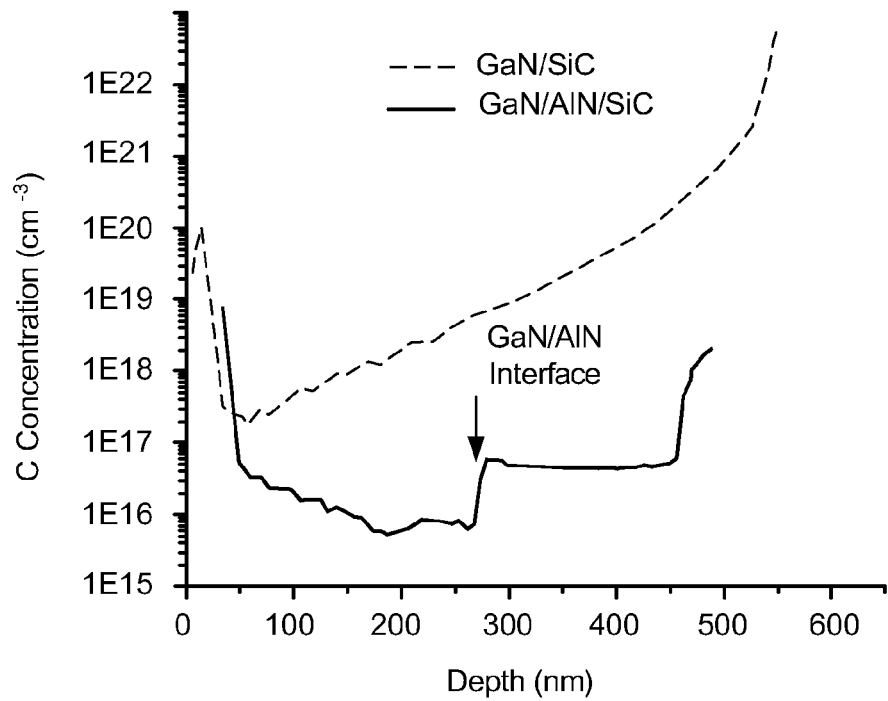
FIG. 2 is a graph of SIMS measurements of C incorporation in GaN/SiC and GaN/AlN/SiC buffer structures (GaN buffer and AlN nucleation layer), wherein the nitride films are of N-polarity grown on C-face SiC.

FIGS. 1 and 2 show that an AlN nucleation layer lowers Si and C concentration in the GaN buffer (above the GaN/AlN interface in FIGS. 1 and 2), as compared to a device without the AlN nucleation layer. FIG. 4 shows buffer conduction is higher and less uniform as a function of $V_{DS}$ as compared to buffer conduction in the device with an AlN nucleation layer.

FIGS. 4-8 and FIG. 10 illustrate a method for fabricating N-face nitride-based electronic devices with low parasitic resistance, comprising capping an N-face semiconductor device structure 600, 700, 800 with a conductive $Al_xGa_yIn_{1-x-y}N$ layer 620, 714, 718, 812 to provide access and/or contact resistances which are lower than those obtained in a structure which is without the conductive layer 622, 714, 718, 812 but with the same ohmic metallization scheme (816 and 818 for example). The conductive layers may be intentionally doped beyond the background level.

FIG. 5 shows that the $Al_xGa_yIn_{1-x-y}N$ layer 620, 714, 718, 812 is typically doped to achieve a smaller tunneling barrier (and narrower depletion region) for electrons between the N-face semiconductor device structure and an ohmic metal on the device structure, and to achieve a Fermi level for the device which is closer to or above the conduction band edge, in the region between the 2DEG and surface, as compared to a device which does not have an intentionally doped $Al_xGa_yIn_{1-x-y}N$ layer 620, 714, 718, 812.

The method may further comprise finishing the $Al_xGa_yIn_{1-x-y}N$ layer 812 with a layer of higher indium content 814 so as to utilize a higher density of intrinsic bulk and surface charges present in indium nitride (compared to lower indium content materials) to reduce the tunneling barrier for electrons (compared to a device without the finishing layer) between the semiconductor device structure (comprised of layers 802, 806, 808 and 812, for example) and the ohmic metal (816 and 818), wherein the higher indium content layer 814 can be doped, graded, grown digitally, or grown digitally and graded.

The (Al,Ga,In)N layers in the present invention are N-face, also known as N-polar or (000-1) oriented layers. This means that the device layers, conductive layers, nucleation layers, etc., are grown in the (000-1) direction on the substrate and the last grown surface of each layer is an N-face. The arrow 1014 in FIG. 10 indicates the N-face (000-1) direction. For example, in FIG. 10, the N-faces 1016-1022 are the last grown surfaces of the layers 1002, 1006, 1008, 1012, respectively.

REFERENCE

The following references are incorporated by reference herein:

[1] C. Poblenz, P. Waltereit, S. Rajan, U. K. Mishra, J. S. Speck, P. Chin, I. Smorchkova and B. Heying, J. Vac. Sci. Technol. B 23, 1562 (2005).
[2] S. Heikman, S. Keller, S. P. DenBaars and U. K. Mishra, Appl. Phys. Lett. 81, 439 (2002).
[3] C. Poblenz, P. Waltereit, S. Rajan, S. Heikman, U. K. Mishra and J. S. Speck, J. Vac. Sci. Technol. B 22, 1145 (2004).
[4] T. B. Fehlberg, G. A. Umana-Membreno, G. Parish, B. D. Nener, C. S. Gallinat, G. Koblemuller, S. Bernardis and J. S. Speck, International Workshop on Nitride Semiconductors 2006, Technical Digest, pp. 152.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching, without fundamentally deviating from the essence of the present invention. It is intended that the scope of the invention be limited not by this detailed description, but rather by the claims appended hereto.

What is claimed is:

1. A method for fabricating nitrogen face (N-face) High Electron Mobility Transistor (HEMT) device, comprising:
   (a) depositing a channel GaN layer on or above an AlGaN barrier layer so that a two dimensional electron gas (2DEG) channel forms in the channel GaN layer;
   (b) depositing a gate and an insulator between the gate and the channel GaN layer;
   (c) depositing a plurality of n-type AlGaInN layers on opposite sides of the insulator, the plurality of n-type AlGaInN layers contacting the channel GaN layer; and
   (d) depositing a source and a drain on the plurality of n-type AlGaInN layers and on opposite sides of the gate; wherein:
   the AlGaN barrier layer, the channel GaN layer, and the plurality of n-type AlGaInN layers are N-face layers, and
   the HEMT device is characterized as having one or more ohmic contacts made to the 2DEG without having to go through the AlGaN barrier layer.

2. A nitrogen face (N-face) High Electron Mobility Transistor (HEMT) device comprising:
   a channel GaN layer on or above an AlGaN barrier layer;
   a two dimensional electron gas (2DEG) channel in the channel GaN layer;
   a gate;
   an insulator between the gate and the channel GaN layer;
   a plurality of n-type AlGaInN layers on opposite sides of the insulator, the plurality of n-type AlGaInN layers contacting the channel GaN layer; and
   a source and a drain on the plurality of n-type AlGaInN layers and on opposite sides of the gate; wherein:
   the AlGaN barrier layer, the channel GaN layer, and the plurality of n-type AlGaInN layers are N-face layers, and
   the HEMT device is characterized as having one or more ohmic contacts made to the 2DEG without having to go through the AlGaN barrier layer.

3. The HEMT device of claim 2, wherein the plurality of n-type AlGaInN layers consist of $n^+$ GaN layers.

4. The HEMT device of claim 2, wherein the ohmic contacts are made to the 2DEG without having to go through a conduction band discontinuity.

5. The HEMT device of claim 2, wherein the plurality of n-type AlGaInN layers have bandgaps and polarization coefficients which are smaller than those of the channel GaN layer.

6. The HEMT device of claim 2, wherein the plurality of n-type AlGaInN layers consist of graded InGaN layers.

7. The HEMT device of claim 2, further including a plurality of layers between the source and the plurality of n-type AlGaInN layers, and between the drain and the plurality of n-type AlGaInN layers, wherein the plurality of layers has a higher indium composition than the plurality of n-type AlGaInN layers.

8. The HEMT device of claim 7, wherein the plurality of layers consists of InN.

9. The HEMT device of claim 2, wherein the n-type AlGaInN layers contact opposite sides of the channel GaN layer.

10. The HEMT device of claim 2, further comprising a GaN layer on a side of the AlGaN barrier layer opposite the channel GaN layer.

11. The method of claim 1, wherein the plurality of n-type AlGaInN layers consist of $n^+$ GaN layers.

12. The method of claim 1, wherein the ohmic contacts are made to the 2DEG without having to go through a conduction band discontinuity.

13. The method of claim 1, wherein the plurality of n-type AlGaInN layers have bandgaps and polarization coefficients which are smaller than those of the channel GaN layer.

14. The method of claim 1, wherein the plurality of n-type AlGaInN layers consist of graded InGaN layers.

15. The method of claim 1, further comprising depositing a plurality of layers between the source and the plurality of n-type AlGaInN layers, and between the drain and the plurality of n-type AlGaInN layers, wherein the plurality of layers has a higher indium composition than the plurality of n-type AlGaInN layers.

16. The method of claim 15, wherein the plurality of layers consists of InN.

17. The method of claim 1, wherein the n-type AlGaInN layers contact opposite sides of the channel GaN layer.

18. The method of claim 1, further comprising depositing a GaN layer on a side of the AlGaN barrier layer opposite the channel GaN layer.

\* \* \* \* \*